(12) United States Patent
Radkevich et al.

(10) Patent No.: US 8,956,455 B2
(45) Date of Patent: Feb. 17, 2015

(54) SEED CRYSTAL HOLDER FOR GROWING SINGLE CRYSTAL FROM MELT

(75) Inventors: Olexy V. Radkevich, Schaumburg, IL (US); Volodimir Protsenko, Hoffman Estates, IL (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 2210 days.

(21) Appl. No.: 11/705,648

(22) Filed: Feb. 13, 2007

(65) Prior Publication Data

US 2008/0190358 A1    Aug. 14, 2008

(51) Int. Cl.
*C30B 35/00* (2006.01)
*C30B 15/32* (2006.01)

(52) U.S. Cl.
CPC .............. *C30B 15/32* (2013.01); *Y10S 117/911* (2013.01)
USPC ........... 117/208; 117/200; 117/206; 117/218; 117/222; 117/911

(58) Field of Classification Search
USPC .................. 117/200, 206, 208, 218, 222, 911
See application file for complete search history.

(56) References Cited

U.S. PATENT DOCUMENTS

| 4,613,486 | A | * | 9/1986 | Tatsumi et al. | 117/217 |
| 5,370,078 | A | * | 12/1994 | Kou et al. | 117/209 |
| 5,948,164 | A | * | 9/1999 | Iida et al. | 117/218 |
| 6,139,632 | A | * | 10/2000 | Izumi | 117/200 |
| 2004/0083945 | A1 | * | 5/2004 | Iino et al. | 117/13 |

FOREIGN PATENT DOCUMENTS

| GB | 1381417 A | * | 1/1975 | ............... B01J 17/18 |
| JP | 55007537 A | * | 1/1980 | ............. C30B 15/00 |

* cited by examiner

*Primary Examiner* — Matthew Song
(74) *Attorney, Agent, or Firm* — Peter Kendall

(57) ABSTRACT

A seed crystal holder for growing single crystals, such as for use in scintillation detectors for nuclear medicine. The holder includes a cooling shaft, a fastener attached to the cooling shaft, and a gasket for separating the cooling shaft from the seed crystal. The gasket is made of a heat-transferable material such as steel wool or metallic foil to conduct heat from the seed crystal to the cooling shaft, while also providing a cushioning effect to cushion the seed crystal against potentially damaging motion forces.

15 Claims, 2 Drawing Sheets

SEED CRYSTAL HOLDER FOR GROWING SINGLE CRYSTAL FROM MELT

TECHNICAL FIELD

The current invention relates to the field of single crystals, and growing large single crystals for use in nuclear medicine imaging applications.

BACKGROUND OF THE INVENTION

A single crystal, also called monocrystal, is a crystalline solid in which the crystal lattice of the entire sample is continuous and unbroken to the edges of the sample, with no grain boundaries. Single crystals are used in many applications, such as scintillators in nuclear medicine imaging including PET and SPECT detectors, in addition to other fields such as semiconductor manufacturing, lasers, telescopes, turbines, etc.

Fabrication of single crystals usually involves the growing of a crystal layer by layer. Techniques to produce large single crystals (boules) include slowly drawing a rotating "seed crystal" in a molten bath of feeder material. A seed crystal is a small piece of single crystal material from which a large crystal of usually the same material is to be grown.

One commonly used method of growing single crystals is the Czochralski (CZ) process. The CZ process is often used to grow large cylindrical boules. In the CZ process, a starting material, such as silicon, sodium iodide, etc., is heated in a crucible to produce a melt. A seed crystal is slowly lowered over the melt so that the seed crystal itself may begin to melt slightly.

The seed crystal is then gently brought into contact with the melt. The temperature of the melt is lowered to cause the melt to freeze onto the seed crystal. As this occurs, the seed crystal is slowly pulled out of the melt and is rotated at the same time. By precisely controlling the temperature gradients, rate of pulling and speed of rotation, it is possible to extract a large, single crystal, cylindrical ingot from the melt. When the crystal reaches its predetermined length, the rate of pulling is increased to pull the crystal away from the melt to prevent further growth. The grown crystal is then cooled to be used for its designated purpose.

A crystal grown by the CZ method is highly susceptible to dislocations. A dislocation is a crystallographic defect, or irregularity, within a crystal structure. The presence of dislocations strongly influences many of the properties of real materials.

Some causes of dislocations in single crystals include dislocations in the seed crystal and thermal shock, caused by rapid cooling of the crystal as it is removed from the melt.

Thermal shock occurs when a thermal gradient causes different parts of an object to expand by different amounts. This differential expansion can be understood in terms of stress or of strain, equivalently. At some point, this stress overcomes the strength of the material, causing a crack to form. If nothing stops this crack from propagating through the material, it will cause the crystal's structure to fail.

Dash necking is one method used to help prevent thermal shock. In dash necking, the seed crystal is rapidly pulled from the melt in the beginning of the process. This creates a thin portion, or neck, of crystal that is virtually dislocation free. However, since the neck is thin it is subject to cracking especially when it is used to support a large single crystal.

A second method used to help prevent thermal shock is to chill the shaft that holds the seed crystal. The shaft controls the dissipation of heat from the single crystal to better control thermal shock. However, there is a possibility that the seed crystal will slip out of the holder. The seed crystals are often brittle and, therefore, it may be difficult to tightly hold the seed crystal without damaging it.

In order to overcome the problem of holding the seed crystal and to prevent damage during assembly, a cushioning material is often placed between the seed crystal and the holder. However, the cushioning material itself is heat-insulating, which undesirably limits the heat-transferability of the cooling shaft.

SUMMARY OF THE INVENTION

Provided is a seed crystal holder. The seed crystal holder includes a cooling shaft, a fastener coupled to the cooling shaft, and a gasket for interfacing the cooling shaft to the seed crystal. The gasket is made from heat-transferable or conductive material.

Further provided is an apparatus for growing a single crystal from a seed crystal. The apparatus includes a crucible, a heating source, a cooling shaft that lowers the seed crystal into the crucible and removes a single crystal from the crucible, a fastener for attaching the seed crystal to the cooling shaft, and a heat-conductive, cushioning gasket between the seed crystal and the cooling shaft.

Further provided is a method of attaching a seed crystal to a cooling shaft. The method includes the steps of coupling the seed crystal to a fastener, coupling a heat-transferable cushioning gasket to the seed crystal, and coupling the fastener to the cooling shaft such that the cushioning gasket is interfaced between the seed crystal and the cooling shaft.

BRIEF DESCRIPTION OF THE DRAWINGS

The invention will now be described in greater detail in the following by way of example only and with reference to the attached drawings, in which.

DETAILED DESCRIPTION OF THE INVENTION

As required, disclosures herein provide detailed embodiments of the present invention; however, the disclosed embodiments are merely exemplary of the invention that may be embodied in various and alternative forms. Therefore, there is no intent that specific structural and functional details should be limiting, but rather the intention is that they provide a basis for the claims and as a representative basis for teaching one skilled in the art to variously employ the present invention.

Figure 1:
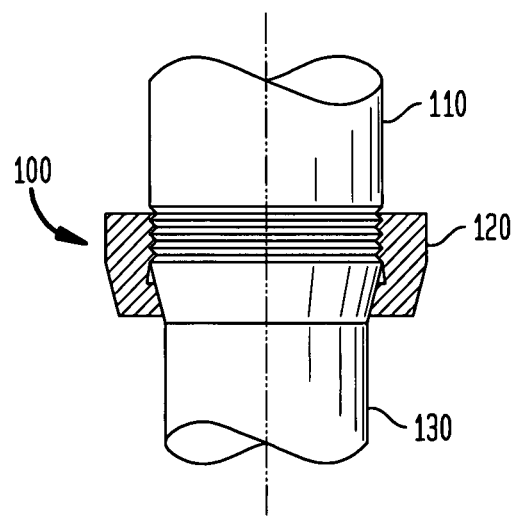
FIG. 1 is a cross sectional view of a conventional seed crystal holder.

FIG. 1 is a cross sectional view of a conventional seed crystal holder 100, such as described in U.S. Pat. No. 4,485,072, incorporated by reference herein in its entirety. Seed crystal holder 100 is comprised of a cooling shaft 110 and a fastener 120, such as a cap nut. Fastener 120 securely holds a seed crystal 130 to cooling shaft 110. In order to prevent the seed crystal 130 from slipping out of the holder, a good thermal connection to cooling shaft 110 is needed. However, seed crystal 130 is usually fragile and therefore it is difficult to tightly attach seed crystal 130 to cooling shaft 110 without damaging seed crystal 130.

Figure 2:
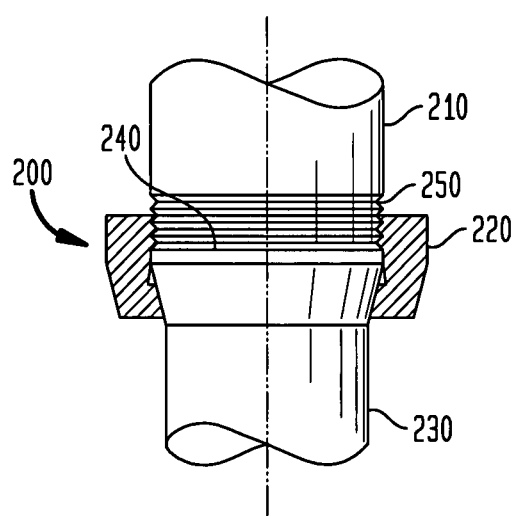
FIG. 2 is a cross sectional view of a seed crystal holder in accordance with one embodiment of the present invention.

FIG. 2 is a cross sectional view of a seed crystal holder 200 in accordance with an embodiment of the present invention. Seed crystal holder 200 is comprised of a cooling shaft 210, a fastener 220 such as a cap nut, and a gasket 240. Fastener 220 securely holds a seed crystal 230 to cooling shaft 240. Gasket 240 provides a cushioning effect to the seed crystal 230 to prevent structural damage to the seed crystal, and is made of a heat-conductive or heat-transferable material such that heat is transferred from the seed crystal to the cooling shaft 210.

Fastener 220 preferably is a threaded cap nut that screws onto cooling shaft 210 threaded portion 250, but is not limited to such implementation for purposes of the invention. The fastener may securely couple to cooling shaft 240 by any means known in the art, including but not limited to: friction fitting, snap fitting, set screws, bolts, clips, cotter pins, etc.

Gasket 240 may be comprised of stainless steel wool, layers of metallic foil, or any other suitable heat-transferable, cushioning material. Gasket 240 may have substantially the same diameter as cooling shaft 210 and/or seed crystal 230, or may have a larger diameter and be compressed by fastener 220. Gasket 240 may be positioned between and make physical contact with cooling shaft 210 and seed crystal 230.

Gasket 240 may allow for continuous heat-transfer from seed crystal 230 to cooling shaft 210 even when seed crystal 230 begins to deform. Because of the ability of gasket 240 to deform, the space between seed crystal 230 and cooling shaft 210 may always be filled by gasket 240. Further gasket 240 may protect seed crystal 230 against undesired forces during the assembly process.

Figure 3:
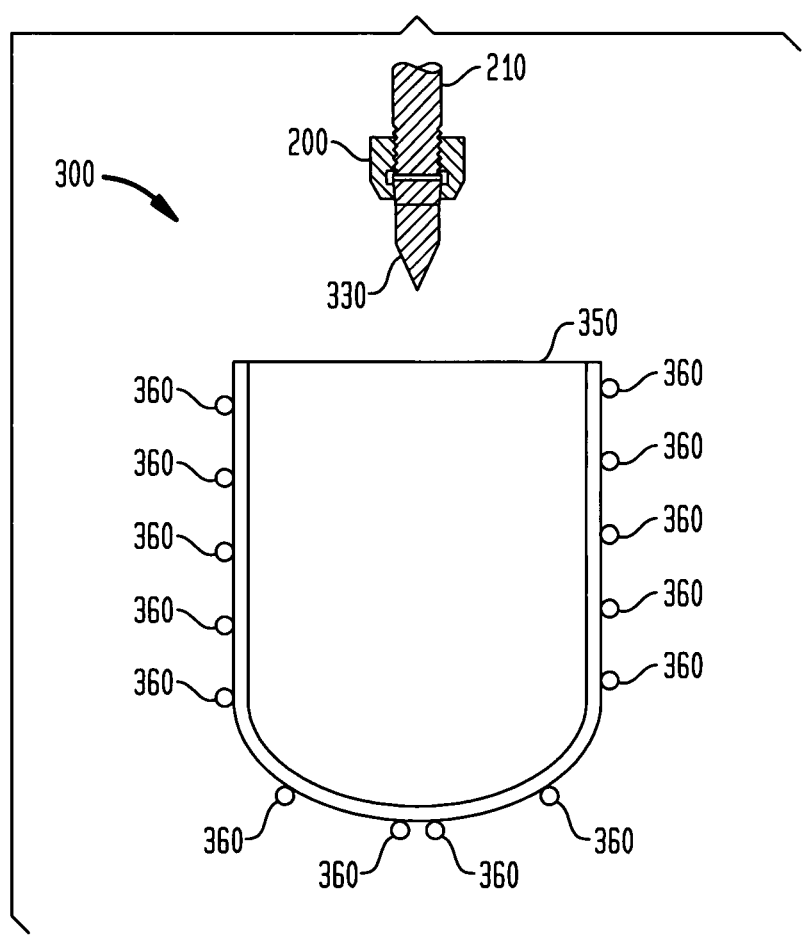
FIG. 3 is a cross sectional view of an apparatus for growing single crystals using the seed crystal holder of the present invention.

FIG. 3 shows an apparatus 300 for growing single crystals using seed crystal holder 200 in accordance with the present invention. Apparatus 300 includes seed crystal holder 200, a seed crystal 330, a crucible 350 and a heating source 360.

Crucible 350 may be used to contain the melted feeder material from which a single crystal is to be grown. Crucible 350 may be composed of any material capable of withstanding the heat necessary to melt the crystal feeder material, including but not limited to silica.

Heating source 360 may be any suitable heating source that is capable of raising the temperature of crucible 350 to the melting point of the crystal substance. Heating source 360 may be electric heating coils surrounding crucible 350 (as shown in FIG. 3), a flame (not shown), or any other suitable heating means known in the art.

Cooling shaft 210 of seed crystal holder 200 may be capable of raising and lowering into and out of crucible 350. Cooling shaft 210 may also be capable of rotating around its vertical axis.

Figure 4:
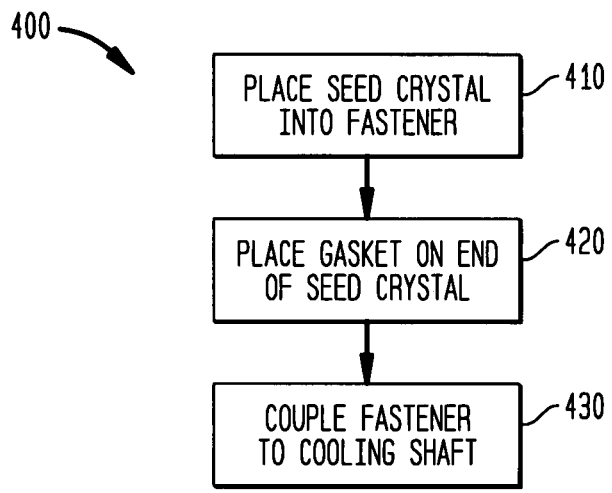
FIG. 4 is a flow chart of a method of the present invention.

FIG. 4 is a flow diagram explaining a method 400 of growing a single crystal in accordance with another aspect of the invention. At step 410, a seed crystal such as seed crystal 330 is coupled to a fastener such as fastener 220. At step 420, a cushioning, heat-transferable gasket is positioned on the end of the seed crystal coupled to the fastener. The gasket may be inserted into a depression formed by the coupling of the fastener to the end of the seed crystal. Next, at step 430, the fastener is coupled to a cooling shaft, such as by screw threading. The assembled seed crystal and holder then can be lowered into a crystal melt for growing of a single crystal boule.

The invention having been thus described, it will be apparent to those skilled in the art that the same may be varied in many ways without departing from the spirit of the invention. Any and all such modifications are intended to be covered within the scope of the following claims.

What is claimed is:

1. A seed crystal holder, comprising:
   a cooling shaft having a first longitudinal axis and a first end;
   a seed crystal having a second longitudinal axis and a second end having a tapered surface;
   a fastener which contacts the tapered surface and fixes the second end to the first end to form an end to end arrangement; and
   a heat-transferable gasket located between the second end and the first end for cushioning the seed crystal and for transferring heat from the seed crystal to the cooling shaft in an axial direction along the first and second longitudinal axes wherein the fastener compresses the heat-transferable gasket and the heat-transferable gasket deforms to fill any spaces between the second end and the first end to provide an even pressure distribution on the heat-transferable gasket for providing continuous thermal contact between the second end, the heat-transferable gasket and the first end and wherein the heat-transferable gasket is comprised of steel wool material.

2. The seed crystal holder of claim 1, wherein the cooling shaft has a threaded portion.

3. The seed crystal holder of claim 2, wherein the fastener has a threaded portion adapted to engage the threaded portion of the cooling shaft.

4. The seed crystal holder of claim 1, wherein at least a portion of the inner surface of the fastener is angled to support the seed crystal.

5. The seed crystal holder of claim 1, wherein the gasket is comprised of metallic foil.

6. The seed crystal holder of claim 1, wherein the gasket has substantially the same diameter as the cooling shaft.

7. An apparatus for growing a single crystal from a seed crystal, comprising:
   a crucible;
   a heating source to heat the crucible;
   a cooling shaft adapted to lower the seed crystal into the crucible and to draw a single crystal from the crucible, the cooling shaft having a first longitudinal axis and a first end;
   a seed crystal having a second longitudinal axis and a second end having a tapered surface;
   a fastener which contacts the tapered surface and fixes the second end to the first end to form an end to end arrangement; and
   a heat-transferable gasket located between the second end and the first end for cushioning the seed crystal and for transferring heat from the seed crystal to the cooling shaft in an axial direction along the first and second longitudinal axes wherein the fastener compresses the heat-transferable gasket and the heat-transferable gasket deforms to fill any spaces between the second end and the first end to provide an even pressure distribution on the heat-transferable gasket for providing continuous thermal contact between the second end, the heat-transferable gasket and the first end and wherein the heat-transferable gasket is comprised of metallic foil.

8. The apparatus of claim 7, wherein the heating source is an electric coil.

9. The apparatus of claim 7, wherein the heating source is a flame.

10. The apparatus of claim 7, wherein the cooling shaft has a threaded portion.

11. The apparatus of claim 10, wherein the fastener has a threaded portion adapted to engage the threaded portion of the cooling shaft.

12. The apparatus of claim 7, wherein at least a portion of the inner surface of the fastener is angled to support the seed crystal.

13. The apparatus of claim 7, wherein the gasket is comprised of a steel wool material.

14. The apparatus of claim 7, wherein the gasket has substantially the same diameter as the cooling shaft.

15. The apparatus of claim 7, wherein the cooling shaft is adapted to rotate.

* * * * *